United States Patent [19]

Mantione

[11] 4,328,554

[45] May 4, 1982

[54] PROGRAMMABLE FREQUENCY SYNTHESIZER (PFS)

[75] Inventor: Joseph L. Mantione, San Diego, Calif.

[73] Assignee: The United States of America as represented by the Secretary of the Navy, Washington, D.C.

[21] Appl. No.: 165,598

[22] Filed: Jul. 3, 1980

[51] Int. Cl.³ .......................................... H03B 19/14
[52] U.S. Cl. ..................................... 364/721; 328/14
[58] Field of Search .......................... 364/721; 328/14

[56] References Cited

U.S. PATENT DOCUMENTS

| | | | |
|---|---|---|---|
| 3,654,450 | 4/1972 | Webb | 364/721 X |
| 3,657,657 | 4/1972 | Jefferson | 328/14 |
| 3,757,096 | 9/1973 | Moonier | 364/721 |
| 3,882,403 | 5/1975 | Gerken | 328/14 |
| 3,973,209 | 8/1976 | Nossen et al. | 328/14 |
| 4,068,178 | 1/1978 | Tunzi | 328/14 |
| 4,240,034 | 12/1980 | Lowenschuss | 328/14 |

Primary Examiner—David H. Malzahn
Attorney, Agent, or Firm—Richard S. Sciascia; Ervin F. Johnston; John Stan

[57] ABSTRACT

A programmable frequency synthesizer (PFS) consists of three serially connected stages: an accumulator, a triangle converter, and a sine shaper. The accumulator is the frequency-generating stage of the synthesizer. It consists of an input latch to store the binary programmed frequency, an adder, an output latch to store the output of the adder, and a clock oscillator. The output frequency of the accumulator can be directly scaled by changing its clocking frequency. The square wave output of the accumulator is divided in frequency by the triangle converter, which produces a triangularly shaped staircase waveform. The sine shaper stage employs diode limiters and filters to produce low-harmonic sinusoids from the triangular staircase.

14 Claims, 6 Drawing Figures

BASIC COMPONENTS OF PROGRAMMABLE FREQUENCY SYNTHESIZER.

BASIC ACCUMULATOR.

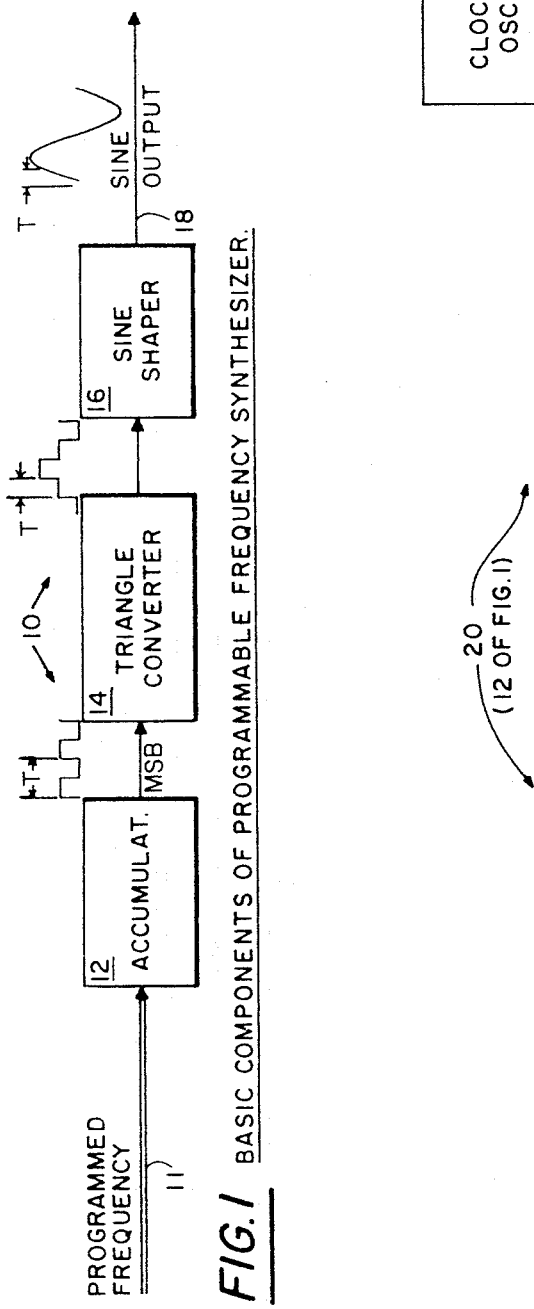
FIG.1 BASIC COMPONENTS OF PROGRAMMABLE FREQUENCY SYNTHESIZER.
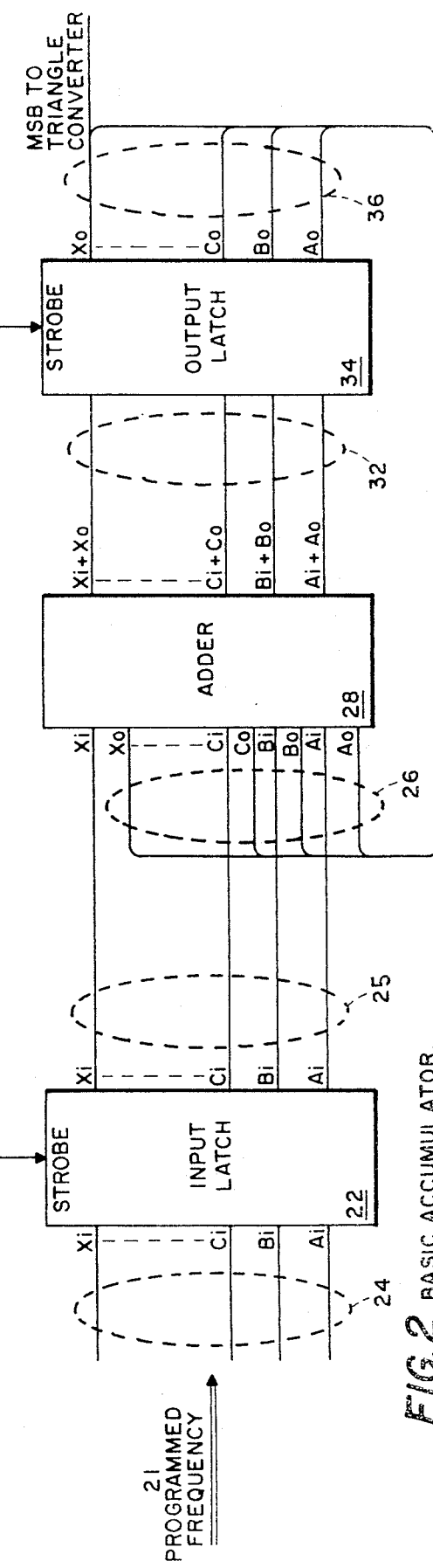
FIG.2 BASIC ACCUMULATOR.

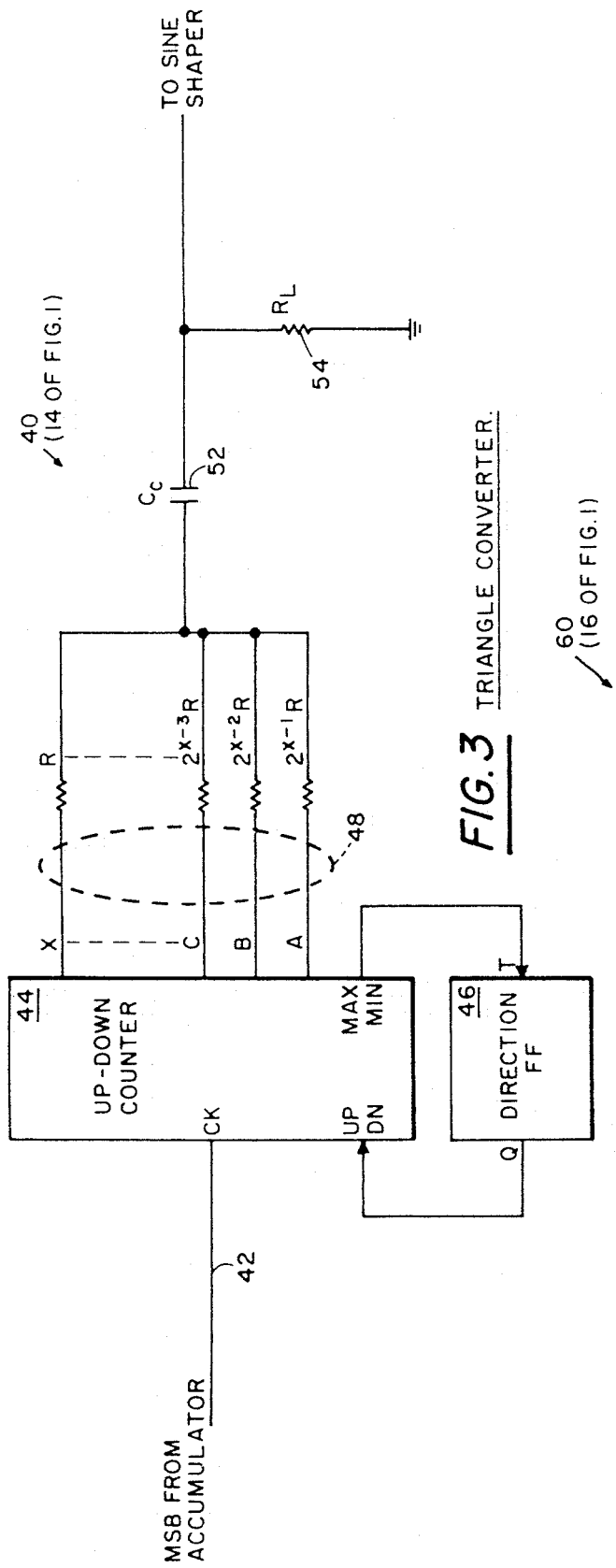
FIG. 3 TRIANGLE CONVERTER.
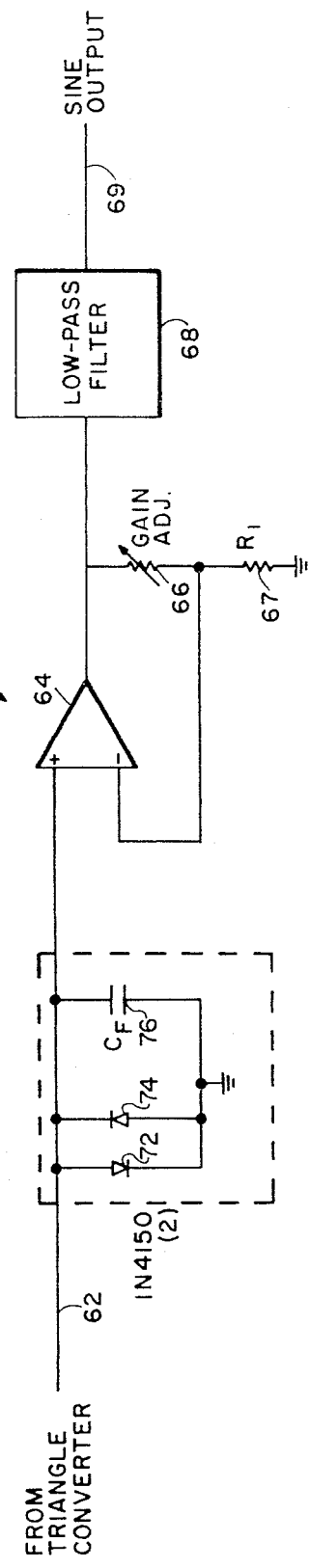
FIG. 4 SINE SHAPER.

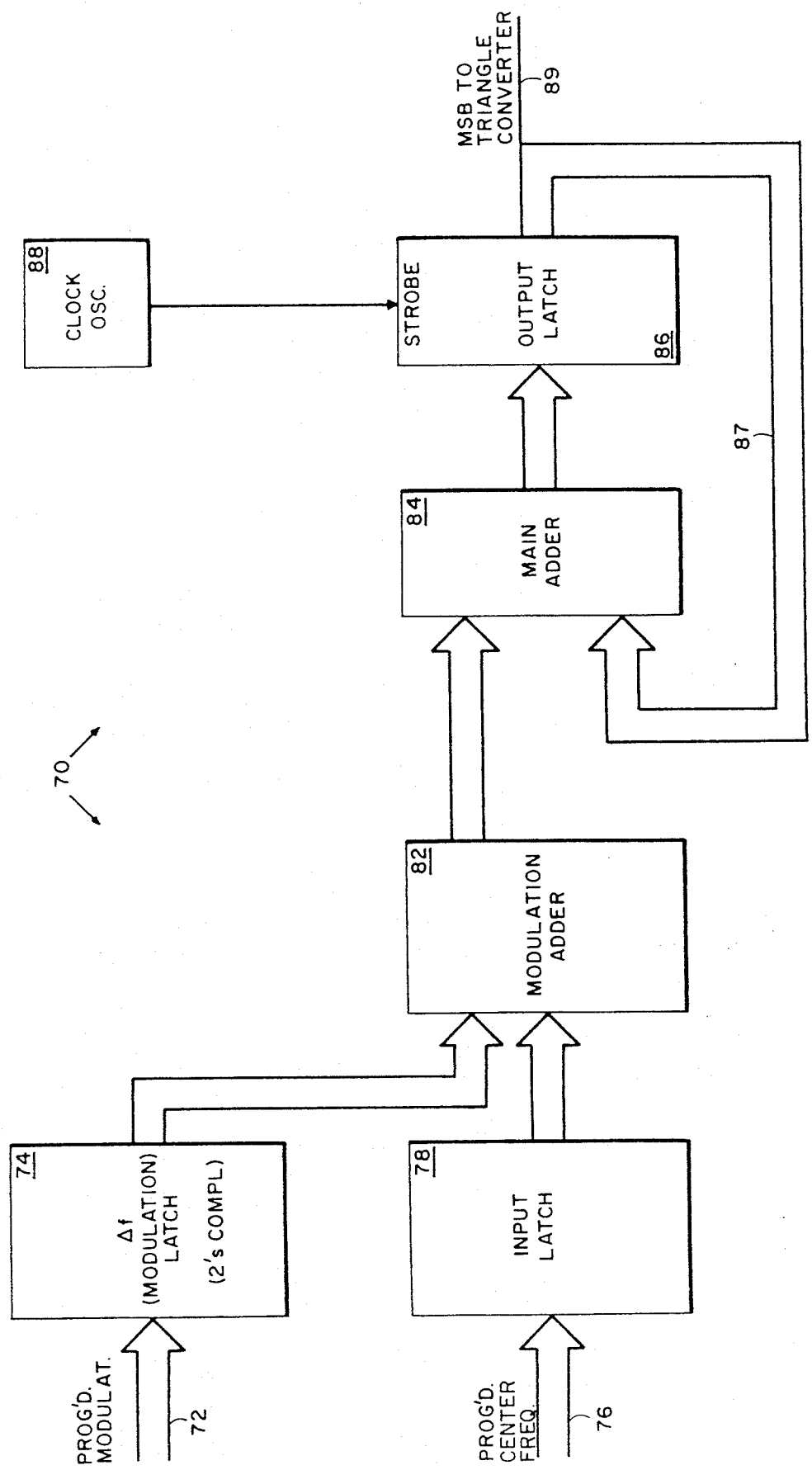
FIG. 5  ACCUMULATOR, CONFIGURATION FOR FREQUENCY MODULATION.

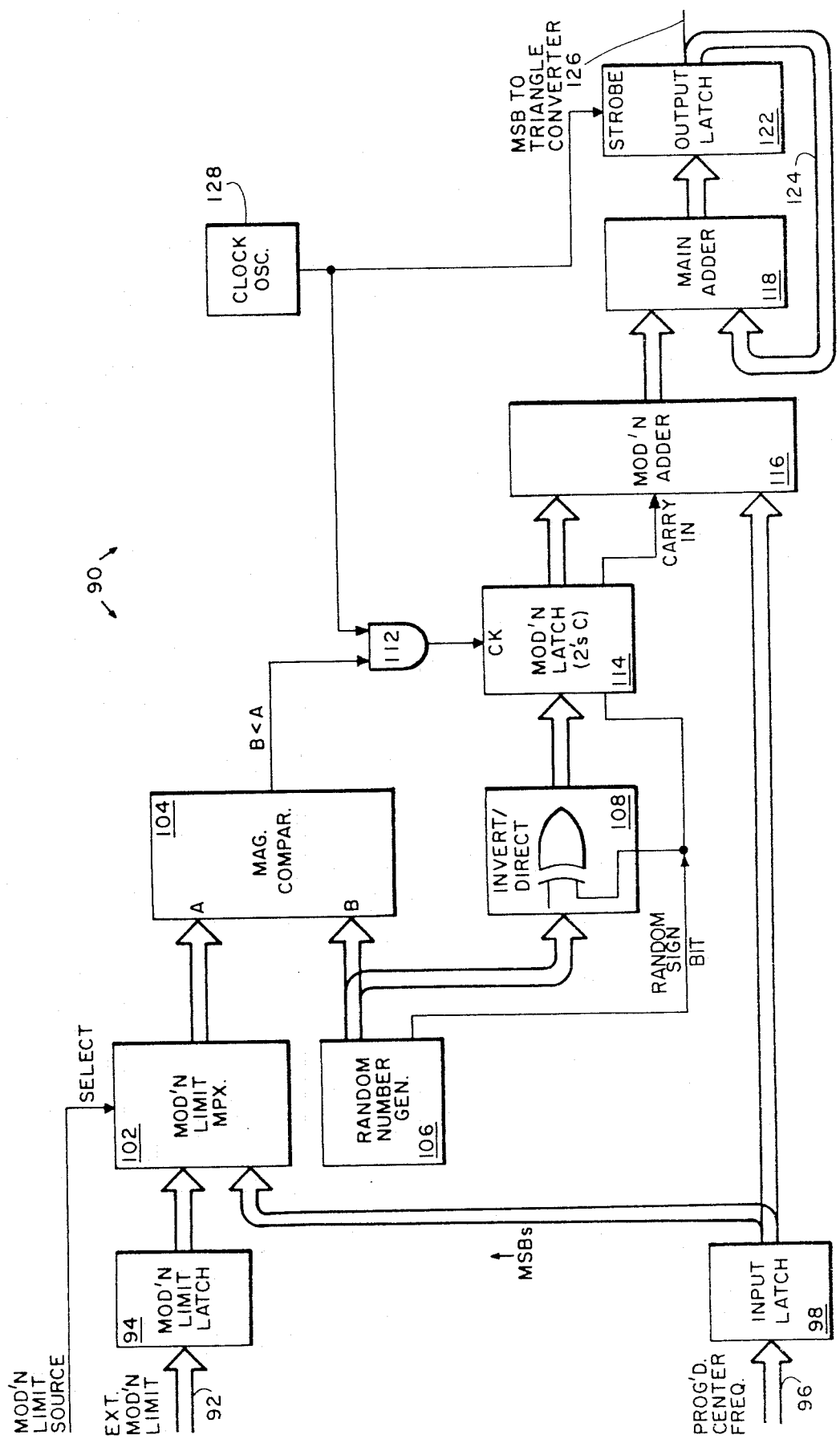
FIG.6  ACCUMULATOR, CONFIGURATION FOR RANDOM FREQUENCY MODULATION.

PROGRAMMABLE FREQUENCY SYNTHESIZER (PFS)

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Prior art attempts at designing programmable frequency synthesizers involved either the use of phase-locked loops (PLL) or preprogrammed lookup tables stored in a read-only memory (ROM). Both of these prior art techniques have serious disadvantages.

Phase-locked loops were found to be unsuitable for wide-range synthesizer applications because of their long acquisition time in this mode and because of the susceptibility of their oscillator to noise.

One prior art synthesizer which used a lookup table required a sinusoid to be digitized and programmed into a read-only memory. This synthesizer is described by Lawrence R. Rabiner and Bernard Gold, in the book entitled *Theory and Application of Digital Signal Processing*, published in 1975 by Prentice-Hall, Inc., Englewood Cliffs, N.J. The disadvantage of this approach was that the amount of memory and filtering required became large when low-harmonic sinusoids were desired over a wide band of frequencies. A second scheme also involving lookup tables utilized a counter to divide a known clock frequency to generate the output. The values stored in the table were compared with the output of the counter, but the values were inversely related to the frequencies actually programmed. Because of this inverse relationship, quantization errors were introduced in generating the values for the table and precise frequency increments could be obtained. Furthermore, the necessity for a custom read-only memory was a deterrent in itself if it could be otherwise avoided.

The programmable frequency synthesizer of this invention does not require a read-only memory or any other custom hardware, with the possible exception of the clock oscillator, which is an element that is required for all prior art embodiments also. A simple resistance-capacitance clock oscillator may be used if its inaccuracy is acceptable, although a crystal-controlled oscillator is recommended for precise applications.

SUMMARY OF THE INVENTION

A programmable frequency synthesizer comprises a basic accumulator for receiving a signal comprising a sequence of pulses having two levels, the sequence defining a binary number which, in turn, defines a specific frequency. The accumulator generates any of a plurality of square-wave signals, depending upon the specific frequency to which it is programmed.

A first signal converter, whose input is connected to the accumulator converts its square-wave input signal into steps of a staircase waveform having a triangular envelope. The frequency of the square-wave is thus divided by the number of steps in a complete staircase cycle. Hence it is termed a triangle converter.

A second signal converter, whose input is connected to the output of the first signal converter, converts its input staircase waveform signal into a sinusoidal signal. Hence, this second converter is termed a sine shaper.

The basic accumulator comprises an input latch, which receives the input pulses, and remains in one of two binary states until the level at its input changes, whereupon it remains in the other binary state until the input level changes again.

An adder, having two inputs, one input being connected to the output of the input latch, adds the signals received at its inputs.

An output latch, substantially identical to the input latch, has two inputs, one being connected to the output of the adder, the output of the output latch being connected to the second input to the adder.

The output of the adder is a signal which is the sum of the signal at the input to the input latch and the signal at the output of the output latch.

The accumulator further comprises a clock, or timer, whose output is connected to the second input to the output latch, for clocking the signal propagating through the output latch.

In the synthesizer, the first signal converter, that is, the triangle converter, comprises an up-down counter, whose input is connected to the output of the basic accumulator, for receiving the most significant bit, the Xth bit, therefrom, for counting, that is, incrementing, the counter until all X bits of the counter are 1, whereupon the direction flipflop is toggled so that the counter will decrement until all bits become 0 and the incrementing begins anew. The counter has a plurality of outputs equal in number to the number X of significant bits.

A plurality of X resistors are connected in series with each of the X outputs of the counter, the resistors having relative resistance values of $2^{X-1}R$, $2^{X-2}R$, ..., R, the resistors each having one end connected to a common junction.

An impedance combination has two parts, one part being connected to the common junction, the other end being connected to the input of the sine shaper.

In the synthesizer the second signal converter, that is, the sine shaper, comprises a signal shaper, whose input is connected to the output of the first signal converter, the triangle converter, for converting the triangular staircase waveform into a waveform which is substantially sinusoidal. A filter, whose input is connected to the output of the signal shaper, filters out any harmonics in its input signal.

OBJECTS OF THE INVENTION

An object of the invention is to provide a frequency synthesizer which can generate frequencies in sets of 1 Hz or less.

Another object of the invention is to provide such a synthesizer having decades of range.

A further object is to provide such a synthesizer with a minimum of components, and to use standard off-the-shelf components throughout.

Yet another object of the invention is to provide a synthesizer which can be frequency modulated under digital control or by an analog function via an analog-to-digital converter.

Still another object of the invention is to provide a synthesizer which has the capability of randomly modulating its frequency within any selected band limits.

These and other objects of the invention will become more readily apparent from the ensuing specification when taken together with the drawings.

BRIEF DESCRIPTION OF THE DRAWINGS

FIG. 1 is a block diagram showing the basic components of the programmable frequency synthesizer of this invention.

FIG. 2 is the block diagram showing the basic accumulator, one of the three main components of the synthesizer.

FIG. 3 is a diagram, partially block and partially a circuit diagram, of the triangle converter, a second major component of the frequency synthesizer.

FIG. 4 is a schematic diagram of the sine shaper, the third major component of the synthesizer.

FIG. 5 is a block diagram of an accumulator configured for frequency modulation.

FIG. 6 is a block diagram of a third form of the accumulator, configured for random frequency modulation.

DESCRIPTION OF THE PREFERRED EMBODIMENTS

The programmable frequency synthesizer 10, shown in FIG. 1, consists of three principal stages: the accumulator 12, the triangle converter 14, and the sine shaper 16. The accumulator 12 is the frequency-generating stage of the synthesizer, which may be implemented in different configurations, as is described hereinbelow. Its square wave output is divided in frequency by the triangle converter stage 14, which produces a triangularly shaped staircase waveform. The sine shaper 16 employs diode limiters and filters (70, FIG. 4) to produce sinusoids from the triangular staircase. The sine shaper 16 includes a buffering amplifier 64, which may also be used for amplitude control.

A basic accumulator 20 is shown in FIG. 2. It is termed a basic accumulator in contrast with the more complex accumulators, 70 and 90, shown in FIGS. 5 and 6. The basic accumulator 20, FIG. 2, consists of an input latch 22 which stores the binary frequency, an adder 28, an output latch 34 which stores the output 32 of the adder, and a clock oscillator 38. The program frequency is strobed into input latch 22 of the accumulator 20 by means of leads 24. The signal from the output 25 of the input latch 22 forms one input to adder 28. The output 36 of the output latch 34 is fed back to the other input of the adder 28.

Since circuit 20 simply adds the value of the input latch 22 to the previous value of the output latch 34, it is known as an accumulator. The rate of accumulation is determined by the clocking rate of the output latch 34. Only the most significant bit (MSB) of the output latch 34 is connected to the following triangle converter stage 14, FIG. 1.

For clarity, the operation of an 8-bit accumulator 20 is described herein, although the concept is clearly adaptable to systems of any number of bits.

Consider a system in which the adder 28 and the two latches, 22 and 34, are each designed to handle 8 bits. The required clocking rate must be $(2^N)D$, where N is the number of bits in the accumulator 20 and D is the dividing factor of the triangle converter stage, that is D is the number of "stairs" in a complete cycle of the staircase waveform. For simplicity let it be assumed that D=1 and that there is no other scale-multiplying factor involved, so that the clocking rate is 256 Hz. If it were desired to get a 1-Hz output from the accumulator 20, the input latch would be programmed with the binary number one, 0000 0001. Assuming that the output latch 34 is initially clear, it will take 128 clock periods to increment to 1000 0000 and another 128 clock periods to overflow back to 0000 0000. With a 256 Hz clocking rate, the most significant bit of the output latch 34 will change once every 256 clock intervals at a 1-Hz rate, which is the frequency which was desired.

If a 2-Hz output were desired, the input latch 22 would be programmed with the binary number two, 0000 0010. The accumulator 20 will then incremented twice the previous rate, causing the most significant bit of the output latch 34 to change at a 2-Hz rate. By induction, it should be clear that any desired frequency can be generated by causing the accumulator 20 to increment at that rate. The maximum generated frequency is limited only by the number of bits in the accumulator 20, and is equal to $2^{N-1}$ Hz. N, as before, is the number of bits in the accumulator 20.

The output frequency of the synthesizer 10, FIG. 1, can be directly scaled by changing its clocking frequency. For example, multiplying the clocking rate by a factor of 10 will cause the accumulator 12 to increment that much faster, thus multiplying the output frequency by 10. This feature is useful in frequency synthesizer applications for changing ranges or scaling factors.

A phase uncertainty exists in the synthesizer for frequencies approaching $2^{N-1}$ Hz. Programmed frequencies which do not divide into $2^N$ evenly, that is, without a remainder, will cause a phase uncertainty because of that remainder. For example, if 3 Hz were programmed into the 8-bit system described hereinabove, the ideal duration of the 3-Hz cycle should be 256/3 or 85⅓ cycles of the clock 38, FIG. 2. However, since transitions will occur only on whole cycles of the clock, such as 85 or 86 cycles, a small amount of phase uncertainty is introduced. In this example, the maximum phase uncertainty for this frequency will be $(2/3)/(256/3)=0.78\%$. Although this amount of uncertainty may be acceptable for many applications, the uncertainty becomes more significant at higher frequencies. At 100 Hz for example, the maxium phase uncertainty in the same 8-bit system will be $(56/100)/(256/100)=22\%$. This value is much too large for a precise synthesizer application.

Two approaches may be employed to reduce the phase uncertainty to an acceptable level. The first is to increase the number of bits in the accumulator 12, FIG. 1, which inherently reduces the error fraction. The second method of reducing phase error requires the use of a frequency divider following the accumulator 12, with an accompanying increase in the clocking rate by the same amount. This method reduces the phase uncertainty by the amount of frequency division. In the synthesizer 10, this division is accomplished in the triangle converter stage 14.

Referring back to FIG. 1, the triangle converter stage 14 performs two functions in the synthesizer 10. First, it divides in frequency the square wave output from the accumulator 12 into a triangularly shaped staircase waveform, and secondly it reduces the phase uncertainty of the accumulator, as is discussed hereinabove.

As is shown in FIG. 3, this stage 40 consists of an up-down counter 44 whose outputs are weighted and summed with resistors in the output 48, a direction changing flip-flop 46, a d-c blocking capacitor 52 and a load resistor 54.

The counter 44 is clocked directly from the most significant bit of the accumulator stage 12, FIG. 1. When the counter 44, FIG. 3, reaches its maximum or minimum value, it toggles direction flip-flop 46 to reverse the direction of the counter. The amount of frequency division produced by this stage and the number of points in a staircase waveform are determined by the number of bits in the up-down counter 44. In this configuration, the amount of frequency division is $2^{N+1}-2$, where N is the number of bits in the counter 44. With a 4-bit counter 44, for example, the frequency division factor will be 30, causing 30 stairs to be generated in each staircase cycle. The resistors, designated by R, are weighted in a binary R-2R-4R-8R manner to generate the triangular staircase waveform. For best symmetry in the following stage, the peak current from the parallel combination of resistors R should be limited to 10 ma or less. The value of $R_L$, 54, should be selected to produce the optimum sinusoidal waveform with the type of diodes used in the following stage. As a first approximation to its value, it should limit the voltage applied to the next stage to a peak of ±0.7 V.

The capacitor 52 is used to block the d-c component of the triangular staircase waveform while passing the a-c component. Its value should be large enough to pass the lowest programmable frequency without distortion.

Referring back to FIG. 1, the sine wave shaper 16, which is the final stage in the synthesizer 10, converts the triangular staircase waveform from the previous stage, the triangle converter 14, into a low-harmonic sinusoid. This is accomplished by utilizing the exponential current-voltage characteristic of diodes to limit the triangles into sines.

As is shown in FIG. 4, the sine shaper 60 consists of two sine shaping diodes, 72 and 74, a filtering capacitor 76, a buffering amplifier 64 with gain control, and a low-pass filter 68. The diodes 72 and 74 should be matched to get symmetrical output voltages, and the use of 1N4150 diodes is recommended. This particular diode is readily available at a nominal cost, and is specified to close I-V tolerances so that further hand selecting or matching of diodes is unnecessary.

The diodes 72 and 74 convert the triangular staircase into a sinusoid, but higher order harmonics of the fundamental are still apparent due to the discrete steps from the staircase waveform. These can be filtered out with low pass filters, for example, low-pass filter 68, to any desired extent. The capacitor 76 in parallel with these diodes, 72 and 74, serves this purpose to a first degree, and additional filtering after the buffering amplifier 64 is recommended.

The configuration wherein the accumulator 70 is adapted for frequency modulation is shown in FIG. 5. It requires the addition of a modulation adder 82 between the existing input latch 78 (22 in FIG. 2) and the adder 84 (28 in FIG. 2) of the basic accumulator (20 in FIG. 2). The modulation adder 82 sums the programmed center frequency from the input latch 78 with the modulation word from the modulation latch 74. The modulation must be programmed in digital form, but any desired analog modulating function may be externally digitized and then programmed.

As an example, if 100 Hz were programmed into the input latch 78 as the center frequency, modulation around that frequency could be selected by updating the modulation latch 74. If the instantaneous desired frequency were 103 Hz, the number 3 would be programmed into the modulation latch 74. Similarly, if 97 Hz were the desired instantaneous frequency, the number −3 would be programmed into the modulation latch 74. The modulation value is added to the center frequency in the modulation adder 82. The main adder 84 of the accumulator 70 then operates in the normal manner at the new frequency.

To accomodate the modulation, 2's complement notation must be used to program the modulation latch 74. The positive values from the input latch 78 and in the main part of the accumulator 70 need not be altered. When designing the system, care must be taken when selecting word sizes and modulation limits so that overflow and underflow conditions in the adders 82 and 84 are prevented.

A configuration using an accumulator 90 suitable for random frequency modulation is shown in FIG. 6. This configuration is similar to the one shown in FIG. 5 for frequency modulation, but includes a random number generator (RNG) 106, a modulation limit latch 94 and multiplexer 102, a magnitude comparator 104, and a 2's complement generator 108. Values from the random number generator 106 within the selected modulation limit are used to modulate the center frequency of the accumulator 90. The modulation limit multiplexer 102 may be connected to the modulation limit latch 94, which can be programmed with a fixed ±f limit, or it may be connected to input latch 98 which will limit the modulation to a fixed percentage of the programmed center frequency.

The modulation limit source, selected by the modulation limit multiplexer 102, is gated to one input, at A, of the magnitude comparator 104. The other input, at B, of the comparator 104 comes from the random number generator 106. The comparator 104 generates a logical indication when the random number of the generator 106 is within the allowed limit of modulation. If this indication is true, the modulation latch 114 will be updated from the 2's complement generator 108 on the next clock pulse from the oscillator 128. Otherwise the previous value of the latch 114 will be retained. The random value in the modulation latch 114 is summed with the programmed center frequency in the modulation adder 116, changing the frequency being generated by the accumulator 90.

When the input latch 98 is selected by the modulation limit multiplexer 102 as its source, a number of most significant bits from the latch are directed to the magnitude comparator 104. The fractional limit of modulation around the programmed center frequency is determined by the number of bits so directed. If N is the number of significant bits in the input latch 98 and M is the number of those most significant bits directed to the multiplexer 102, then the modulation limit is $\pm 2^M/2^N$. For example, if three most significant bits are sent to the multiplexer 102 from an 8-bit input latch 98, the modulation limit would be $\pm 2^3/2^8 = 3\%$ around the center frequency. The fractional limit of modulation may then be changed by changing the number of most significant bits sent from the input latch 98.

Since it is desirable to have modulation both above and below the programmed center frequency, both positive and negative numbers must be generated for the modulation adder 116. Two's complement notation has been found to be the most convenient method of complementing positive numbers. The 2's complement of a binary number is obtained by inverting all of its bits and adding 1 to the result. An additional random bit from the random number generator 106 determines the sign of its generated number. This random bit controls the inverting or direct mode of the exclusive-or gates 108 between the random number generator 106 and the modulation latch 114. This sign bit is also brought through the latch 114 as a carry-in bit to the modulation adder 116 when a negative number is formed, fulfilling the requirements of the 2's complement notation. Thus, the sign as well as the magnitude of the modulating word is random.

The modulation latch 114 stores the 2's complement modulation value for the modulation adder 116 in the same manner as described in the configuration 70 for frequency modulation, shown in FIG. 5. The remaining stages of the synthesizer remain unchanged. Care must be taken in system design to prevent overflow or underflow in the adders, 116 and 118, because this will produce erroneous results. Other important considerations are the allocations of word length and the extension of sign bits into the unused left-hand bits of 2's complement numbers.

In summary, the programmable frequency synthesizer is a general-purpose synthesizer of sinusoidal voltages, which has the capability of being precisely programmed in steps of 1 Hz or less, and may have decades of frequency range. It may be configured to modulate its center frequency in digitally controlled steps of 1 Hz or less, or the modulation latch may be driven from an analog-to-digital converter whose input is the desired modulating function, for example sine, sawtooth, etc. It may also be configured to randomly modulate its center frequency within any selected band limits. The range of modulation can be externally set or can be set to be a fraction of the selected center frequency. The synthesizer maintains the frequency stability of the oscillator from which it is driven. It uses standard, readily available complements, yet it produces sinusoidal voltages whose harmonic components can be filtered to any desired degree. Its ranges and scales are limited only by the hardware used to implement it.

With respect to alternative embodiments, the circuits used in the accumulators of the three versions of the synthesizer and in the counter stages may be of any logic family. One restriction is that the output of the up-down counter should have symmetric drive capability between the logical 1 and 0 levels to insure the generation of a symmetrical staircase waveform. The random number generator is a standard digital building block which generates random binary numbers at any desired rate. Simple random number generators are available in integrated circuit form.

The 1N4150 diodes were chosen for their closely specified I-V characteristics and their easy availability. If other diodes are used, they should be selected for a variation in $V_F$ of $\pm 7\%$ at 1 ma.

Obviously many modifications and variations of the present invention are possible in the light of the above teachings. It is therefore to be understood that within the scope of the appended claims the invention may be practiced otherwise than as specifically described.

What is claimed is:

1. A programmable frequency synthesizer comprising:
   a first means for accumulating, for receiving an input signal comprising any of a plurality of sequences of pulses having two levels, each sequence defining a programmable binary number which, in turn, defines a corresponding specific frequency, the accumulating means generating any of a plurality of square-wave signals, depending upon the specific frequency to which it is programmed;
   a means for signal converting, whose input is connected to the means for accumulating, which converts a square-wave input signal into a staircase waveform having a triangular envelope but whose frequency is divided by the number of stairs in the complete staircase cycle; and
   a second means for signal converting, whose input is connected to the output of the first converting means, for converting an input staircase waveform signal into a sinusoidal signal; wherein the means for accumulating comprises:
   an input means, which receives the input signal, and remains in one binary state until the level at its input changes whereupon it remains in another binary state whenever the input level changes again;
   means for adding, having two inputs, one input being connected to the output of the input means, for adding the signals received at its inputs;
   an output means, substantially identical to the input means, having two inputs, one being connected to the output of the means for adding, the output of the output means being connected to the second input to the means for adding;
   whereby the output of the means for adding is a signal which is the sum of the signal at the input to the input means and the signal at the output of the output means; the means for accumulating further comprising:
   means, whose output is connected to the second input to the output means, for clocking the signal propagating through the output means.

2. The synthesizer according to claim 1, wherein the first means for converting comprises:
   means for counting, whose input is connected to the output of the first accumulating means, which receives the most significant bit, the Xth bit, therefrom, for counting, that is, incrementing, the counting means until all bits are 1, whereupon the counting means is caused to decrement until all bits become 0 and the incrementing begins anew, the counting means having a plurality of outputs equal in number to the number of significant bits X;
   a plurality of X resistors, one connected in series with each of the X outputs of the counting means, the resistors having relative resistance values of $2^{X-1}R, 2^{X-2}R, \ldots, R$, the resistors each having one end connected to a common junction;
   an impedance combination having two parts, one part being connected to the common junction, the other end being connected to the input of the second signal converting means.

3. The synthesizer according to claim 1, wherein the second means for signal converting comprises:
   a means for signal shaping, whose input is connected to the output of the first means for signal converting, for converting the triangular staircase waveform into a waveform which is substantially sinusoidal; and
   means for filtering, whose input is connected to the output of said signal shaping means, for filtering out any harmonics in its input signal.

4. The synthesizer according to claim 1 wherein the second means for signal converting comprises:
   a means for signal shaping, whose input is connected to the output of the first means for signal converting, for converting the triangular staircase waveform into a waveform which is substantially sinusoidal; and means for filtering, whose input is connected to the output of said signal shaping means, for filtering out any harmonics in its input signal.

5. The synthesizer according to claim 4, wherein the signal shaping means comprises a parallel combination of:
first and second diodes connected with opposite polarities across the input from the first means for signal converting and a grounded connection; and
a capacitor connected across the same two points.

6. The synthesizer according to claim 4, wherein the second means for signal converting further comprises:
means, whose input is connected to the output of the signal shaping means and whose output is connected to the input of the filtering means, for amplifying the substantially sinusoidal signal.

7. The synthesizer according to claim 6 wherein the amplifying means comprises:
an operational amplifier.

8. The synthesizer according to claim 6, wherein the signal shaping means comprises a parallel combination of:
first and second diodes connected with opposite polarities across the input from the first means for signal converting and a grounded connection; and
a capacitor connected across the same two points.

9. The synthesizer according to claim 8 wherein the amplifying means comprises:
an operational amplifier.

10. A programmable frequency synthesizer for the generation of frequency-modulated (FM) signals, comprising:
a means for accumulating, which receives two input signals each comprising a sequence of pulses having two levels, each sequence defining a programmable binary number, the two numbers in turn, defining a corresponding specific frequency and a corresponding incremental frequency, the accumulating means generating any of a plurality of frequency-modulated square-wave signals, each depending upon the sum of the specific and incremental frequencies to which it is programmed;
a means for signal converting, whose input is connected to the output of the means for accumulating, which converts its FM square-wave input signal into an FM staircase waveform having a triangular envelope but whose frequency is divided by the number of stairs in the complete staircase cycle; and
a second means for signal converting, whose input is connected to the output of the first converting means, for converting its FM input staircase waveform signal into an FM sinusoidal signal.

11. The synthesizer according to claim 10, wherein the means for accumulating comprises:
first input means, having an input and an output, which receives the input pulses defining a specific frequency, and remains in one binary state until the level at its input changes whereupon it remains in another binary state whenever the input level changes again;
second input means, substantially identical to the first input means, which receives the input pulses defining the incremental frequency;
first means for adding, having two inputs and an output, whose two inputs are connected to the outputs of the first and second input means, for adding the two signals at its input, to generate at its output the sum of the specific and incremental frequencies to which it is programmed;
second means for adding, having two inputs, one input being connected to the output of the first means for adding, for adding the signals received at its inputs, and generating a square-wave signal having a frequency which depends on the sum from the first means of adding;
an output means, substantially identical to the first input means, having two inputs, one being connected to the output of the second means for adding, the output of the output means being connected to the second input to the second means for adding;
whereby the output of the second means for adding is a signal which is the sum of the signal at the input to the second adding means and the signal at the output of the output means having as an output any of a plurality of FM square-wave signals depending on the sum of the specific and incremental frequencies to which it is programmed; the means for accumulating further comprising:
means, whose output is connected to the second input to the output means, for clocking the signal propagating through the output means.

12. A programmable frequency synthesizer for the generation of FM signals randomly modulated over any selected band limits, comprising:
a means for accumulating, which receives two input signals, a first and a second input signal, each comprising a sequence of pulses having two levels, each sequence defining a programmable binary number which, in turn, defines a corresponding specific frequency and a corresponding band limit of frequency modulation for that frequency, the accumulating means generating any of a plurality of randomly modulated square-wave signals, depending upon the sum of the specific and modulating frequencies to which it is programmed;
a first means for signal converting, whose input is connected to the means for accumulating, which converts its square-wave input signal into a randomly modulated staircase waveform having a triangular envelope but whose frequency is divided by the number of stairs in the complete staircase cycle; and
a second means for signal converting, whose input is connected to the output of the first converting means, for converting its input staircase waveform signal into a randomly modulated sinusoidal FM signal.

13. A programmable frequency synthesizer according to claim 12 wherein the means for accumulating comprises:
first input means, having an input which receives the first input signal and an output, which defines the specific frequency, a programmed center frequency;
second input means, having an input which receives the second input signal and an output, which defines the band limit of frequency modulation for the programmed center frequency;
means for generating an output signal which comprises a bilevel random number (RN), representing a binary number; and
means adapted to receive the output signal from the RN generating means and the output signal from the first and second input means.

14. A synthesizer according to claim 13 wherein the means for accumulating further comprises:
means connected to the RN generating means, for inverting in a random manner any of the bits in the random number, thereby making the generated number doubly random.

* * * * *